US011843033B2

(12) United States Patent
Wu et al.

(10) Patent No.: US 11,843,033 B2
(45) Date of Patent: Dec. 12, 2023

(54) SELECTIVE LOW TEMPERATURE EPITAXIAL DEPOSITION PROCESS

(71) Applicant: Applied Materials, Inc., Santa Clara, CA (US)

(72) Inventors: Chen-Ying Wu, Santa Clara, CA (US); Abhishek Dube, Fremont, CA (US); Yi-Chiau Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 17/231,087

(22) Filed: Apr. 15, 2021

(65) Prior Publication Data
US 2022/0238650 A1    Jul. 28, 2022

Related U.S. Application Data

(60) Provisional application No. 63/142,790, filed on Jan. 28, 2021.

(51) Int. Cl.
*H01L 29/08* (2006.01)
*H01L 29/66* (2006.01)
(Continued)

(52) U.S. Cl.
CPC ...... *H01L 29/0847* (2013.01); *H01L 21/0262* (2013.01); *H01L 21/02532* (2013.01); *H01L 21/02576* (2013.01); *H01L 21/2252* (2013.01); *H01L 29/167* (2013.01); *H01L 29/6675* (2013.01); *H01L 29/66439* (2013.01); *H01L 29/66772* (2013.01); H01L 29/0665 (2013.01); H01L 29/0673 (2013.01);
(Continued)

(58) Field of Classification Search
CPC ... H01L 23/49838; H01L 24/16; H01L 24/17; H01L 24/49; H01L 24/97; H01L 25/0657; H01L 24/32; H01L 29/0669–068; H01L 29/66787; H05K 3/3436
See application file for complete search history.

(56) References Cited

U.S. PATENT DOCUMENTS 10,002,759 B2  6/2018  Bao et al.
10,177,227 B1  1/2019  Yoshida et al.
(Continued)

FOREIGN PATENT DOCUMENTS

CN    109564934 A    4/2019
KR    10-2042476    11/2019

OTHER PUBLICATIONS

International Search Report and Written Opinion dated Apr. 26, 2022 for Application No. PCT/US2021/065539.

*Primary Examiner* — Brian Turner
(74) *Attorney, Agent, or Firm* — Patterson + Sheridan, LLP

(57) ABSTRACT

A method for the selective formation of epitaxial layers is described herein. In the method, epitaxial layers are deposited to form source and drain regions around a horizontal gate all around (hGAA structure). The method includes co-flowing a combination of chlorinated silicon containing precursors, antimony containing precursors, and n-type dopant precursors. The resulting source and drain regions are selectively grown from crystalline nanosheets or nanowires of the hGAA structure over the non-crystalline gate structure and dielectric layers. The source and drain regions are predominantly grown in a <110> direction.

20 Claims, 5 Drawing Sheets

(51) Int. Cl.
*H01L 29/167* (2006.01)
*H01L 21/02* (2006.01)
*H01L 21/225* (2006.01)
*H01L 29/423* (2006.01)
*H01L 29/775* (2006.01)
*H01L 29/786* (2006.01)
*H01L 29/06* (2006.01)

(52) U.S. Cl.
CPC ...... *H01L 29/42392* (2013.01); *H01L 29/775* (2013.01); *H01L 29/78696* (2013.01)

(56) References Cited

U.S. PATENT DOCUMENTS

| | | |
|---|---|---|
| 10,205,002 B2 | 2/2019 | Bao et al. |
| 10,510,620 B1* | 12/2019 | Chanemougame .......................... H01L 29/66439 |
| 2010/0117154 A1* | 5/2010 | Ye ..................... H01L 29/66628 257/E27.06 |
| 2010/0252862 A1* | 10/2010 | Ko ........................ H01L 29/785 257/E29.081 |
| 2016/0240623 A1* | 8/2016 | Chang ............. H01L 21/823814 |
| 2017/0069763 A1 | 3/2017 | Doris et al. |
| 2017/0194430 A1 | 7/2017 | Wood et al. |
| 2017/0221708 A1 | 8/2017 | Bergendahl et al. |
| 2018/0033872 A1 | 2/2018 | Bao et al. |
| 2018/0308686 A1* | 10/2018 | Xie ................... H01L 29/41725 |
| 2018/0358436 A1* | 12/2018 | Jambunathan ...... H01L 29/0673 |
| 2021/0028280 A1 | 1/2021 | Liu et al. |
| 2021/0391423 A1* | 12/2021 | Lin ................... H01L 29/42392 |
| 2022/0052174 A1* | 2/2022 | Lo ..................... H01L 29/66439 |

\* cited by examiner

SELECTIVE LOW TEMPERATURE EPITAXIAL DEPOSITION PROCESS

CROSS-REFERENCE TO RELATED APPLICATIONS

This application claims priority to U.S. Provisional Patent Application No. 63/142,790, filed Jan. 28, 2021, the entirety of which is herein incorporated by reference.

BACKGROUND

Field

Embodiments of the present disclosure generally relate to a method for forming a semiconductor device. More specifically, the application relates to epitaxial deposition methods for horizontal gate all around (hGAA) device structures.

Description of the Related Art

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate-all-around (hGAA) structure. The hGAA device structure includes several lattice matched channels suspended in a stacked configuration and connected by source/drain regions.

However, challenges associated with hGAA structures include the formation of an n-channel metal oxide semiconductor (NMOS) source/drain regions at low temperatures. Conventional approaches to the formation of NMOS source/drain regions at low temperatures result in precursor incompatibility and selectivity loss. Conventional approaches also utilize separate etching and deposition steps, which increase the cost of device production. However, increasing the temperature of formation of the NMOS source/drain regions may increase the rate of diffusion of dopants throughout the hGAA structure and requires longer ramp up/ramp down times.

Therefore, there is a need for a method of forming NMOS source/drain regions on an hGAA structure at lower temperatures and without additional etching operations.

SUMMARY

The present disclosure generally includes methods for forming source/drain regions on a semiconductor structure. More specifically, embodiments of the present disclosure include a method of forming a semiconductor device. The method of forming the semiconductor device includes forming a multi-material layer on a substrate, wherein the multi-material layer includes a plurality of crystalline first layers and a plurality of non-crystalline second layers arranged in an alternating pattern. A source region and a drain region are selectively formed on the crystalline first layers of the substrate, wherein the formed source region and drain region contain an antimony concentration of greater than about $5 \times 10^{20}$ atoms/cm$^3$. The forming the source region and the drain region further includes flowing a chlorinated silicon containing precursor, co-flowing an antimony-containing precursor with the chlorinated silicon containing precursor, co-flowing an n-type dopant precursor with the chlorinated silicon containing precursor and the antimony-containing precursor, and heating the substrate to a temperature of less than about 550° C.

In another embodiment, a semiconductor device is described. The semiconductor device includes a multi-material layer. The multi-material layer includes a plurality of first layers comprising a crystalline silicon material and a plurality of second layers comprising a metal material and a high-k material on outer surfaces of the metal material. The plurality of second layers are arranged in an alternating pattern with the plurality of first layers. The semiconductor device further includes a source region and a drain region. The source region and the drain region are epitaxial layers and include a silicon material, an antimony dopant, and an n-type dopant.

In yet another embodiment, a method of forming a semiconductor device is described. The method of forming the semiconductor device includes selectively growing a source region and a drain region on a substrate in a predominantly <110> direction. The source and the drain regions contain an antimony concentration of greater than about $5 \times 10^{20}$ atoms/cm$^3$. The selectively growing the source and the drain further includes flowing a chlorinated silicon containing precursor into a process chamber with the substrate, co-flowing an antimony-containing precursor with the chlorinated silicon containing precursor into the process chamber, co-flowing a phosphorous dopant precursor with the chlorinated silicon containing precursor and the antimony-containing precursor into the process chamber, and heating the substrate to a temperature of less than about 550° C. during the flowing of the chlorinated silicon containing precursor, the antimony-containing precursor, and the phosphorous dopant precursor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to a method for forming a semiconductor device. A method of epitaxial deposition of n-channel metal oxide semiconductor (NMOS) source/drain regions within horizontal gate all around (hGAA) device structures are provided. The method is performed at a temperature of less than about 550° C. The method includes the use of a chlorinated silicon precursor, an antimony containing precursor, and a phosphorous containing precursor.

The chlorinated silicon precursor is utilized to continuously etch the epitaxial layer as it is formed and improves the selectivity of the epitaxial layer as the epitaxial layer is deposited onto a superlattice structure. The epitaxial layer is formed only on the crystalline portions of the superlattice structure and not on oxide or non-crystalline surfaces. The antimony containing precursor lowers the temperature at which the epitaxial layer is deposited and increases the growth rate of the epitaxial layer on the crystalline portions of the superlattice structure. The phosphorous containing precursor dopes the epitaxial layer with phosphorous and enables better adhesion to the crystalline portions of the superlattice structure.

It has also been shown that the growth rate of the epitaxial layer with respect to the exposed crystalline surfaces of the superlattice structure changes with the addition of different concentrations of antimony in the epitaxial layer. In embodiments described herein, the concentration of antimony in the epitaxial layer is greater than about $5 \times 10^{20}$ atoms/cm$^3$ and growth is in primarily the <110> direction. The antimony concentration has been shown to cause the predominant crystal growth in the <110> direction. The crystal growth primarily in the <110> direction reduces faceting of the epitaxial layer on the superlattice structure. Previous methods for growth rate in the <111> direction is limited in grown due to faceting.

Figure 1:
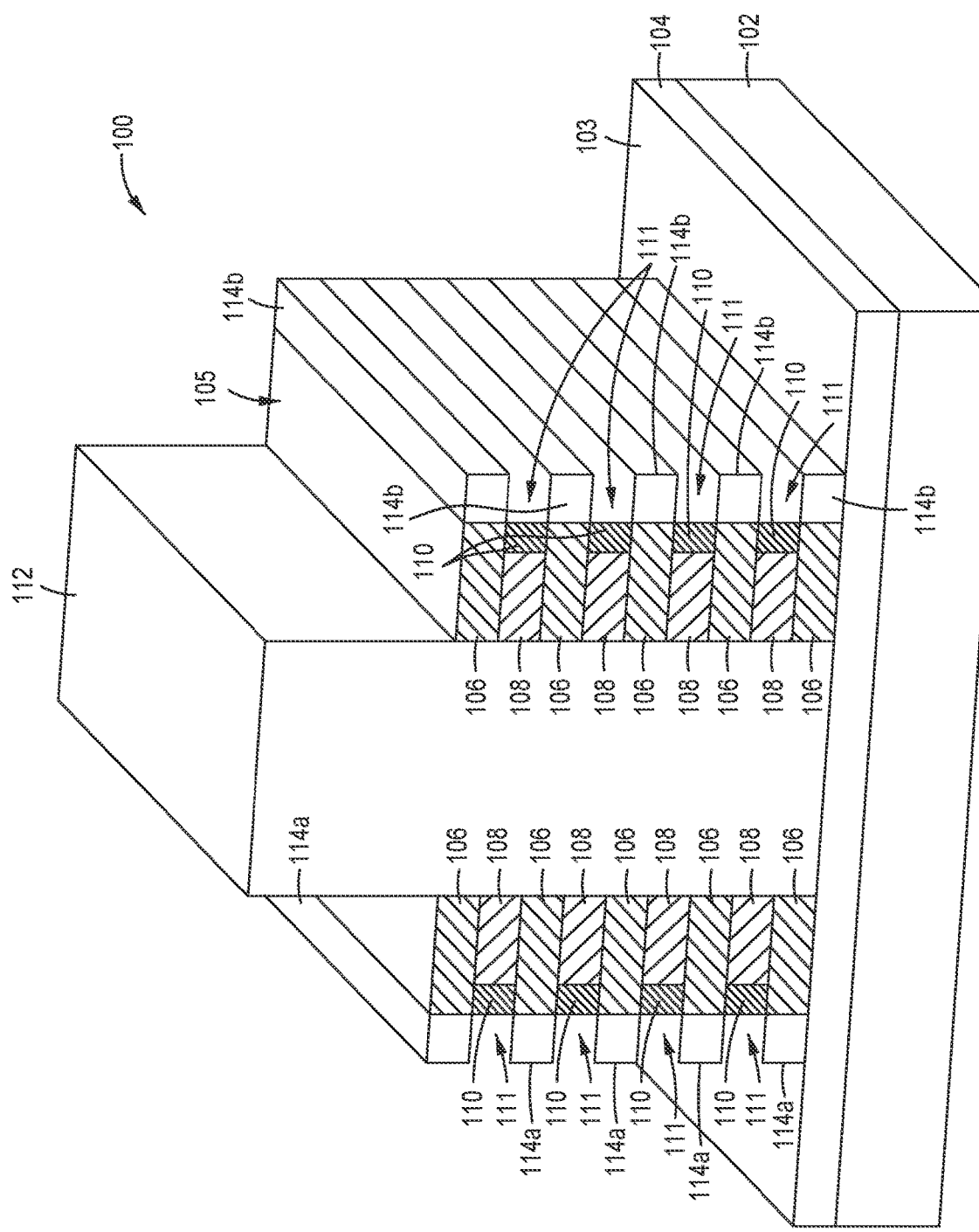
FIG. 1 illustrates a schematic isometric view of an hGAA structure, according to one embodiment.

FIG. 1 illustrates a schematic isometric view of a horizontal gate-all-around (hGAA) structure 100, according to one embodiment. The hGAA structure 100 includes a multi-material layer 105 having alternating first layers 106 and second layers 108 with a spacer 110 formed therein utilized in an hGAA structure 100. The hGAA structure 100 utilizes the multi-material layer 105 as nanowires (e.g., channels) between a source 114a and a drain 114b and a gate structure 112. As shown in the cross-sectional view of the multi-material layer 105 in FIG. 1, the nanowire spacer 110 formed at the bottom (e.g., or an end) of each of the second layers 108 assists in managing the interface between the second layers 108 and the source/drain 114a, 114b so as to reduce parasitic capacitance and maintain minimum device leakage.

The hGAA structure 100 includes the multi-material layer 105 disposed on a top surface 103 of the substrate 102, such as on top of an optional material layer 104 disposed on the substrate 102. In the embodiments in which the optional material layer 104 is not present, the multi-material layer 105 is directly formed on the substrate 102.

The substrate 102 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 102 may have various dimensions, such as 200 mm, 300 mm, 450 mm, or other diameter, as well as, being a rectangular or square panel. Unless otherwise noted, examples described herein are conducted on substrates with a 200 mm diameter, a 300 mm diameter, or a 450 mm diameter substrate.

In one example, the optional material layer 104 is an insulating material. Suitable examples of the insulating material may include silicon oxide material, silicon nitride material, silicon oxynitride material, or any suitable insulating materials. Alternatively, the optional material layer 104 may be any suitable materials including conductive material or non-conductive material as needed. The multi-material layer 105 includes at least one pair of layers, each pair comprising the first layer 106 and the second layer 108. Although the example depicted in FIG. 1 shows four pairs and a first layer 106 cap, each pair includes the first layer 106 and the second layer 108 (alternating pairs, each pair comprising the first layer 106 and the second layer 108). An additional first layer 106 is disposed as the top of the multi-material layer 105. The number of pairs may be varied based on different process needs with extra or without extra first layers 106 or second layers 108 being needed. In one implementation, the thickness of each single first layer 106 may be between about 20 Å and about 200 Å, such as about 50 Å, and the thickness of the each single second layer 108 may be between about 20 Å and about 200 Å, such as about 50 Å. The multi-material layer 105 may have a total thickness between about 10 Å and about 5000 Å, such as between about 40 Å and about 4000 Å.

Each of the first layers 106 is a crystalline layer, such as a single crystalline, polycrystalline, or monocrystalline silicon layer. The first layers 106 are formed using an epitaxial deposition process. Alternatively, the first layers 106 are doped silicon layers, including p-type doped silicon layers or n-type doped layers. Suitable p-type dopants includes B dopants, Al dopants, Ga dopants, In dopants, or the like. Suitable n-type dopant includes N dopants, P dopants, As dopants, Sb dopants, or the like. In yet another example, the first layers 106 are a group III-V material, such as a GaAs layer.

The second layers 108 are non-crystalline material layers. In some embodiments, the second layers 108 are Ge containing layers, such as SiGe layers, Ge layers, or other suitable layers. Alternatively, the second layers 108 are doped silicon layers, including p-type doped silicon layers or n-type doped layers. In yet another example, the second layers 108 are group III-V materials, such as a GaAs layer. In still another example, the first layers 106 are silicon layers and the second layers 108 are a metal material having a high-k material coating on outer surfaces of the metal material. Suitable examples of the high-k material includes hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. In one particular implementation the coating layer is a hafnium dioxide (HfO2) layer. In some embodiments, the second layers 108 are a similar material to the gate structure 112 to form a wraparound gate around the first layers 106.

Each of the spacers 110 are formed adjacent to the ends of the second layers 108 and may be considered a portion of the second layers 108. The spacers 110 are dielectric spacers or air gaps. The spacers 110 may be formed by etching away a portion of each of the second layers 108 using an etching precursor to form a recess at the ends of each of the second layers 108. The spacers 110 are formed in the recesses adjacent each of the second layers 108. A liner layer (not shown) may additionally be deposited within the recesses before the deposition of the spacers 110. The spacers 110 are formed from a dielectric material and separate each of the nanowires or nanosheets formed as the first layers 106. In some embodiments the spacers 110 are selected to be a silicon containing material that may reduce parasitic capacitance between the gate and source/drain structure in the hGAA nanowire structure, such as a low-K material. The silicon containing material or the low-K material may be silicon nitride, silicon oxide, silicon oxynitride, silicon carbide, silicon oxycarbide, silicon carbide nitride, doped silicon layer, or other suitable materials, such as Black Diamond® material available from Applied Materials.

In one embodiment, the spacers 110 are a low-k material (e.g., dielectric constant less than 4) or a silicon oxide/silicon nitride/silicon carbide containing material. In yet other embodiments, the spacers 110 are air gaps.

The gate structure 112 is disposed over and around the multi-material layer 105. The gate structure 112 includes a gate electrode layer and may additionally include a gate dielectric layer, gate spacers, and a mask layer, according to one embodiment. The gate electrode layer of the gate structure 112 includes a polysilicon layer or a metal layer that is capped with a polysilicon layer. The gate electrode layer can include metal nitrides (such as titanium nitride (TiN), tantalum nitride (TaN) or molybdenum nitride ($MoN_x$)), metal carbides (such as tantalum carbide (TaC) or hafnium carbide (HfC)), metal-nitride-carbides (such as TaCN), metal oxides (such as molybdenum oxide ($MoO_x$)), metal oxynitrides (such as molybdenum oxynitride ($MoO_xN_y$)), metal silicides (such as nickel silicide), or combinations thereof. The gate electrode layer is disposed on top of and around the multi-material layer 105.

A gate dielectric layer may optionally be disposed below the gate electrode layer and below the multi-material layer 105. The optional gate dielectric layer can include silicon oxide ($SiO_x$), which can be formed by a thermal oxidation of one or more of the first layers 106 or and/or the second layers 108, or by any suitable deposition process. Suitable materials for forming the gate dielectric layer include silicon oxide, silicon nitrides, oxynitrides, metal oxides such as hafnium oxide ($HfO_2$), hafnium zirconium oxide ($HfZrO_x$), hafnium silicon oxide ($HfSiO_x$), hafnium titanium oxide ($HfTiO_x$), hafnium aluminum oxide ($HfAlO_x$), and combinations and multi-layers thereof. Gate spacers are formed on sidewalls of the gate electrode layer. Each gate spacer includes a nitride portion and/or an oxide portion. A mask layer is formed on top of the gate electrode layer and can include silicon nitride.

The composition and formation of the antimony-doped source/drain regions 114a, 114b on the hGAA structure 100 is described herein.

Figure 2A:
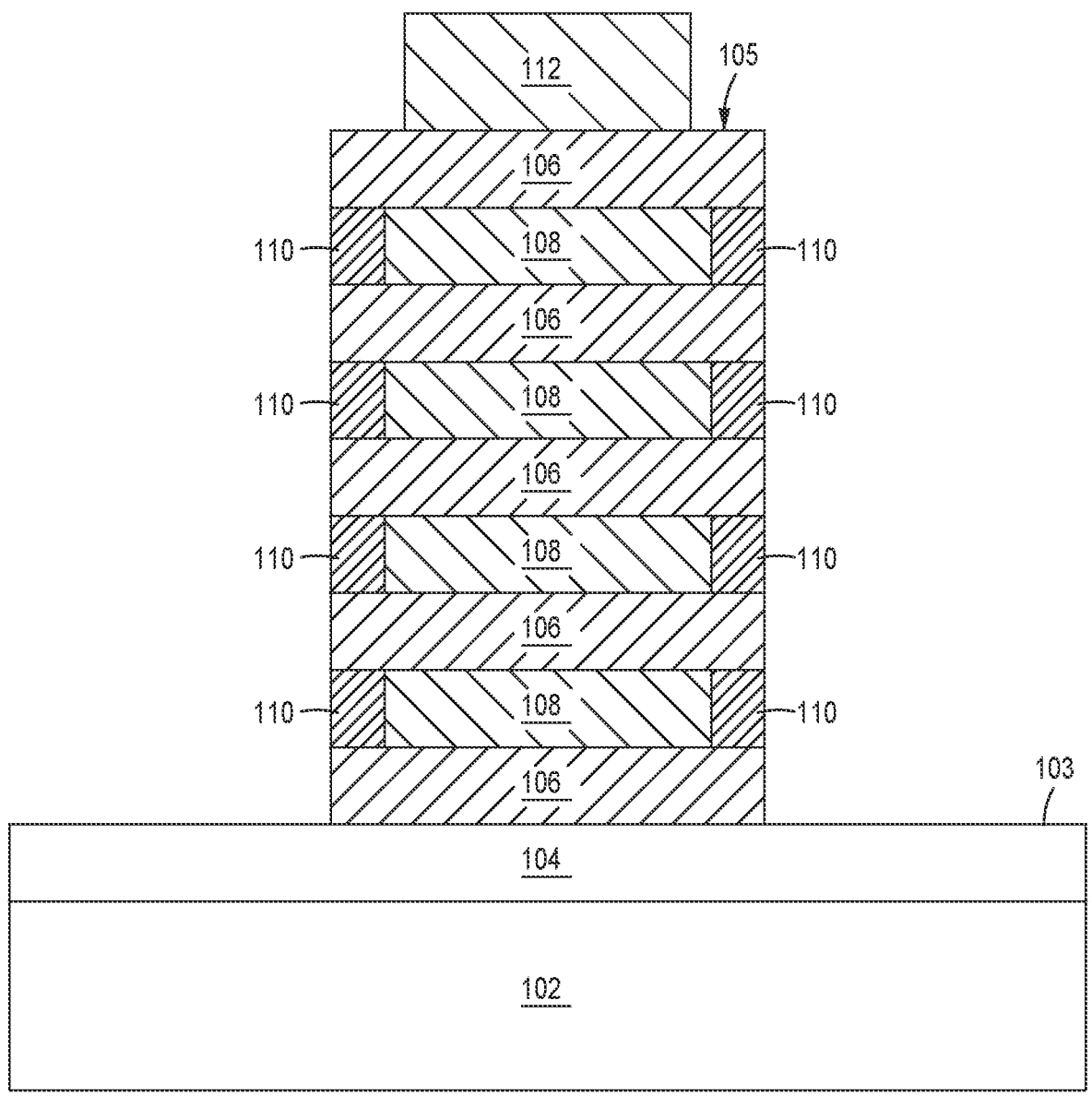
FIG. 2A-2C illustrates a schematic cross-sectional view of the hGAA structure of FIG. 1, according to one embodiment.
Figure 2B:
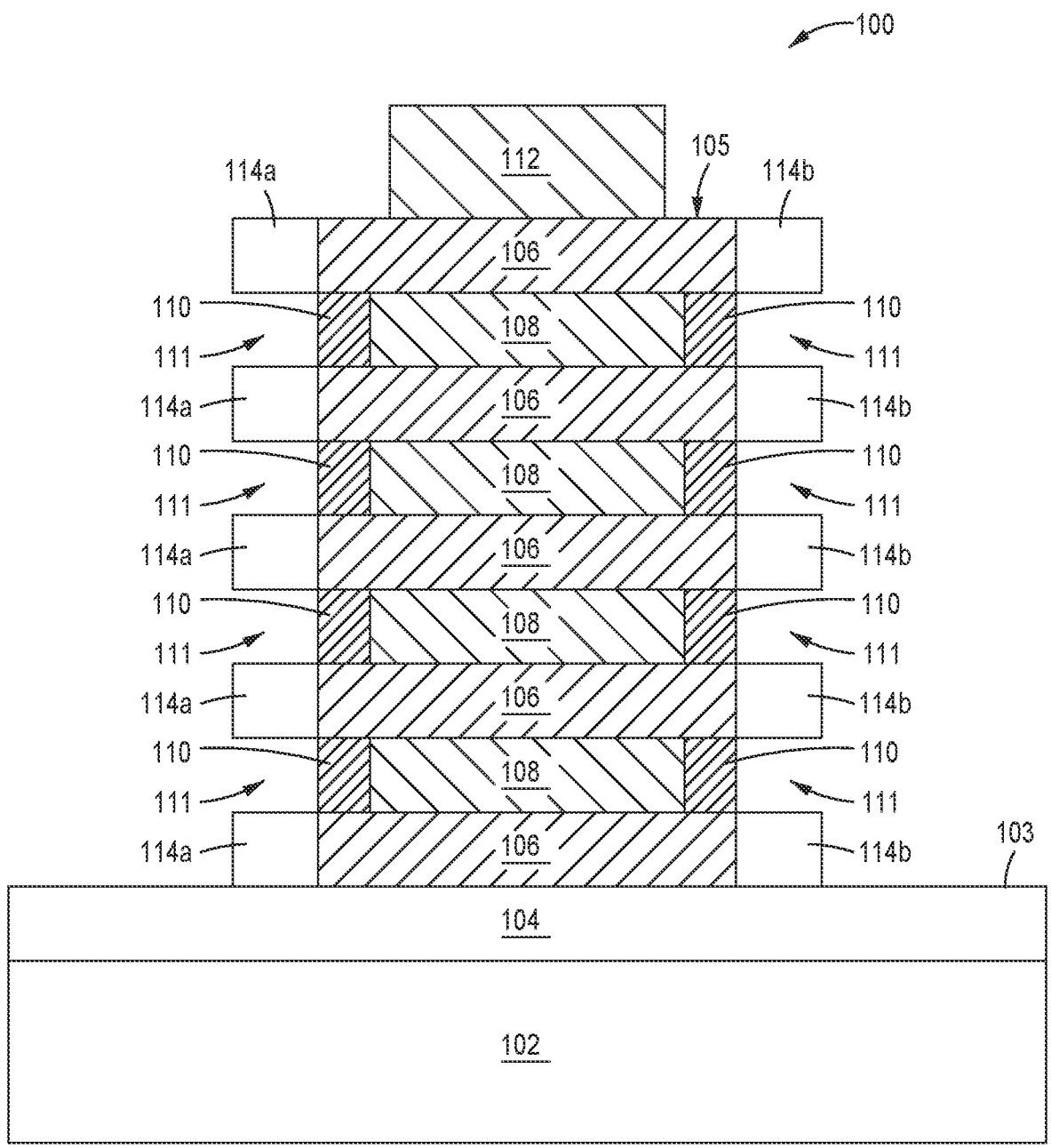
Figure 2C:
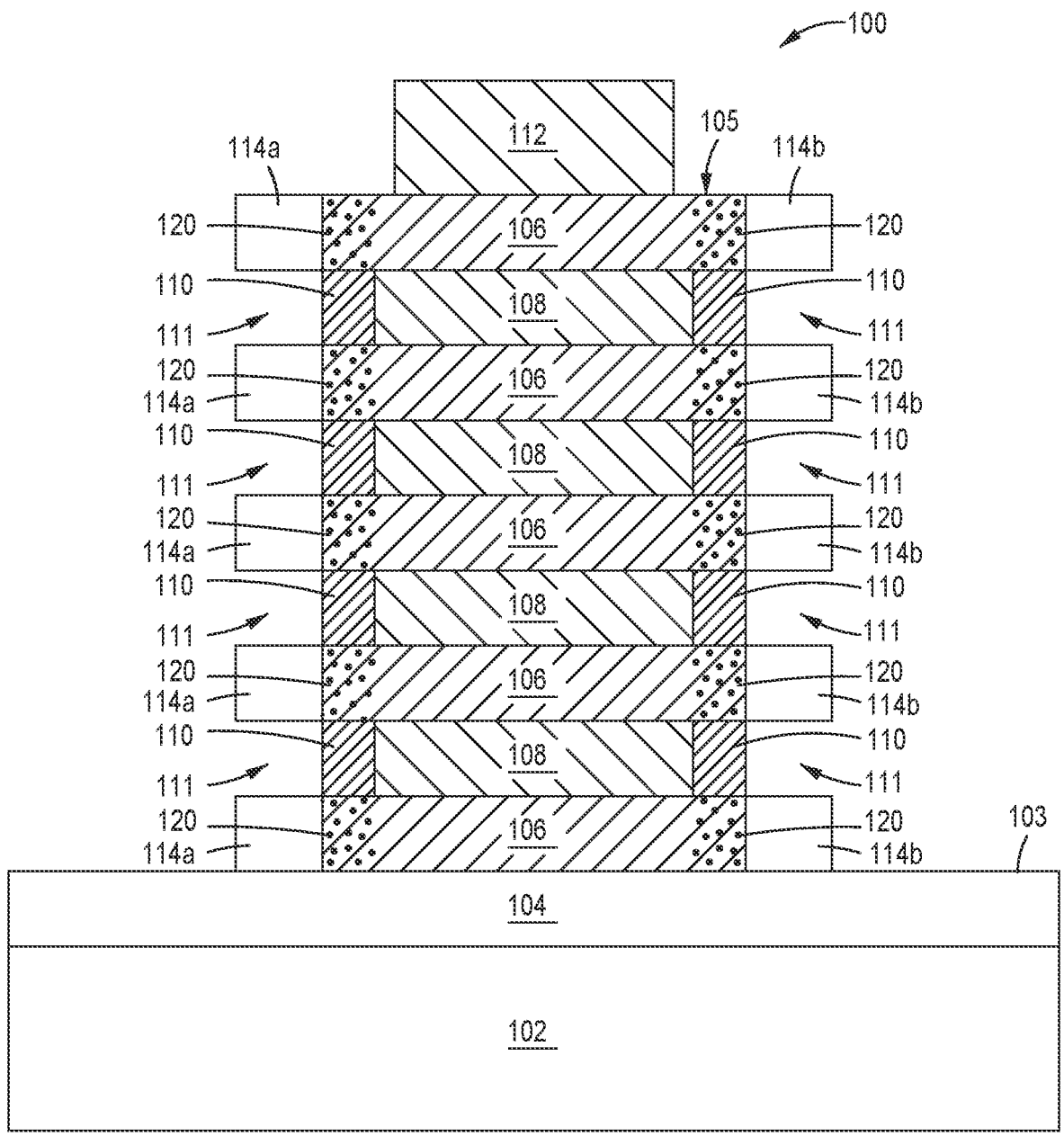
Figure 3:
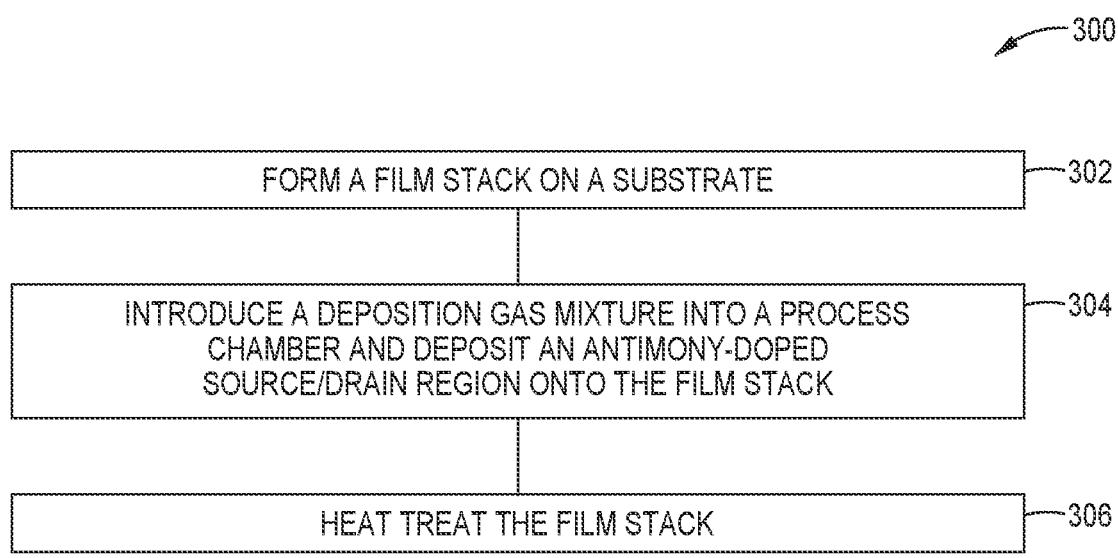
FIG. 3 illustrates a method of forming the hGAA structure of FIGS. 1 and 2A-2C, according to one embodiment.

FIGS. 2A-2C illustrate schematic cross-sectional views of the formation of the hGAA structure 100 of FIG. 1, according to one embodiment. The hGAA structure 100 is formed using a method 300 of FIG. 3. The hGAA structure 100 described herein is an n-channel metal oxide semiconductor (NMOS) device. Therefore, the dopants within the hGAA structure 100 are n-type dopants, such as phosphorus, arsenic, antimony, or any combination of the above. The dopant includes phosphorus (P), according to one embodiment.

The multi-material layer 105 and the gate structure 112 described with respect to FIG. 1 are formed on the substrate 102 and the optional material layer 104 during a first operation 302. After the first operation 302, the hGAA structure 100 is similar to the structure in FIG. 2A. The combination of the multi-material layer 105 and the gate structure 112 may be described as a film-stack herein. During the first operation, the multi-material layer 105 is formed using a plurality of deposition operations to form a plurality of alternating first layers 106 and second layers 108. A portion of the second layers 108 is etched back and the spacers 110 are formed.

The gate structure 112 is formed around the multi-material layer 105. In some embodiments, the gate electrode layer of the gate structure 112 is a similar material to the material of each of the second layers 108 within the multi-material layer 105. The gate structure 112 and the second layers 108 form a wrap-around gate around each of the first layers 106. The first layers 106 act as nanowires or nanosheets disposed within the wrap-around gate. The first layers 106 serve as a channel between source/drain regions after the formation of the source/drain regions.

After the formation of the film-stack during the first operation 302, the antimony-doped source/drain regions 114a, 114b are formed during a second operation 304 as shown in FIG. 2B. During the second operation 304, a deposition gas mixture is introduced into the process chamber to deposit the antimony-doped source/drain regions 114a, 114b. The antimony-doped source/drain regions 114a, 114b are deposited on the substrate 102 and each of the first layers 106 within the multi-material layer 105 as shown in FIG. 2B. The antimony-doped source/drain regions 114a, 114b have a thickness ranging from about 1 nm to about 10 nm. The antimony-doped source/drain regions 114a, 114b are deposited by an epitaxial deposition process, such as a selective epitaxial deposition process within an epitaxial deposition chamber. In embodiments shown herein, the antimony-doped source/drain regions 114a, 114b are deposited on the first layers 106 and exposed portions of the substrate 102, which are fabricated from a crystalline material, such as Si, and the antimony-doped source/drain regions 114a, 114b are not deposited on the gate structure 112 or the spacers 110, which are fabricated from a dielectric material. The deposition process can be performed at a chamber pressure ranging from about 1 torr to about 600 torr, such as from about 200 torr to about 300 torr, and at a deposition temperature (temperature of the substrate) of less than about 550° C., such as less than about 500° C., such as less than about 450° C.

A chlorinated silicon precursor and an antimony (Sb) containing precursor are co-flowed into the process chamber. The chlorinated silicon precursor includes precursors with both silicon and chlorine, such as dichlorosilane ($SiCl_2H_2$) (DCS), trichlorosilane ($SiCl_3H$) (TCS), or any mixture thereof. In some embodiments, a mix of DCS and TCS is used. The mixture of DCS and TCS includes a mixture of DCS to TCS at a ratio of about 1:10 to about 10:1. In some embodiments, TCS has been shown to only grow the antimony-doped source/drain regions 114a, 114b when DCS is present and does not form the antimony-doped source/drain regions 114a, 114b or forms the antimony-doped source/drain regions 114a, 114b at a drastically reduced rate when the DCS is not co-flown therewith. DCS has been shown to increase the growth rate of the antimony-doped source/drain regions 114a, 114b. In some embodiments, there may be other suitable chlorinated silicon containing precursors. The chlorinated silicon precursors enable growth of the antimony-doped source/drain regions 114a, 114b. As the antimony-doped source/drain regions 114a, 114b are grown, etch back operations are not performed. The chlorine within the chlorinated silicon precursor has been shown to improve the crystalline growth of the epitaxial layer without additional etch back processes. The chlorinated silicon containing precursor can have a flow rate ranging from about 1 sccm to about 1000 sccm, such as 1 sccm to about 500 sccm, or 10 sccm to about 1000 sccm. In embodiments described herein, the flowrate of each of DCS or TCS has a flow rate ranging from about 1 sccm to about 1000 sccm, such as 1 sccm to about 500 sccm, or 10 sccm to about 1000 sccm.

The antimony-containing precursor includes one or a combination of stibine ($SbH_3$), antimony trichloride (SbCl$_3$), antimony tetrachloride (SbCl$_4$), antimony pentachloride (SbCl$_5$), triphenylantimony ((C$_6$H$_5$)$_3$Sb), antimony trihydride (SbH$_3$), antimonytrioxide (Sb$_2$O$_3$), antimony pentoxide (Sb$_2$O$_5$), antimony trifluoride (SbF$_3$), antimony tribromide (SbBr$_3$), antimony triiodide (SbI$_3$), antimony pentafluoride (SbF$_5$), Triethyl antimony (C$_6$H$_{15}$Sb) (TESb), and trimethyl antimony (TMSb). In embodiments described herein, TESb is utilized. The antimony antimony-containing precursor may have a flow rate ranging from about 0.1 sccm to about 100 sccm. In some embodiments, a carrier gas, such as nitrogen gas (N$_2$) or hydrogen gas (H$_2$), can be flowed with the chlorinated silicon containing precursor and the arsenic antimony-containing precursor. During the operations described herein, no additional etchant is flowed with the semiconductor containing precursor and the antimony antimony-containing precursor to perform selective etch back.

The amount of excessive point defects in the antimony-doped source/drain regions 114a, 114b can be controlled by varying processing conditions, such as partial pressure of the precursors, ratio of the precursors, processing temperature, and/or layer thickness. The amount of excessive point defects in the antimony-doped source/drain regions 114a, 114b can control the Sb atoms diffusion into the first layers 106 of the multi-material layer 105. During the deposition of the antimony-doped source/drain regions 114a, 114b, Sb atoms can be diffused into the first layers 106 of the multi-material layer 105. P-dopants are added to the antimony-doped source/drain regions 114a, 114b using a P-containing precursor. The P-containing precursor is flown simultaneously to both the chlorinated silicon containing precursor and the antimony containing precursor. The resistivity of the antimony-doped source/drain regions 114a, 114b is about 0.8 mΩ·cm, whereas the resistivity of the P-doped antimony-doped semiconductor layer is reduced further to about 0.5 mΩ·cm to about 0.6 mΩ·cm. In examples described herein, the P containing precursor is phosphine (PH$_3$).

Each of the chlorinated silicon containing precursor, the antimony-containing precursor, and the P-containing precursor are co-flowed into the process chamber simultaneously. Co-flowing each of the chlorinated silicon containing precursor, the antimony-containing precursor, and the P-containing precursor improves the electrical conductivity of the antimony-doped source/drain regions 114a, 114b and enables the deposition temperature to be less than 550° C. In some embodiments, the P-containing precursor is a generic n-type dopant precursor. In embodiments described herein, the ratio of chlorinated silicon containing precursor to antimony-containing precursor, to P-containing precursor flown into the process chamber is about 5:1:5 to about 20:1:20. As described herein, the ratio of chlorinated silicon containing precursor to arsenic antimony-containing precursor, to P-containing precursor may be a ratio of DCS and TCS to TESb to PH$_3$.

The deposited antimony-doped source/drain regions 114a, 114b have an antimony concentration of greater than about 5×10$^{20}$ atoms/cm$^3$, such as greater than about 1×10$^{21}$ atoms/cm$^3$, such as greater than about 2×10$^{21}$ atoms/cm$^3$. The phosphorous dopant concentration within the deposited antimony-doped source/drain regions 114a, 114b is about 1×10$^{20}$ atoms/cm$^3$ to about 5×10$^{21}$ atoms/cm$^3$. The low temperature deposition of the antimony-doped source/drain regions 114a, 114b further decreases the migration of the antimony into other portions of the multi-material layer 105 and the substrate as the antimony diffusion may cause degradation of device performance.

The concentration of the antimony-dopant within the antimony-doped source/drain regions 114a, 114b alters the growth rate of the antimony-doped source/drain regions 114a, 114b. It has been found that with lower concentrations of antimony-dopant or in embodiments without co-flow of the antimony-dopant, the deposition rate of the antimony-doped source/drain regions 114a, 114b at temperatures less than 550° C. is greatly reduced. In some embodiments, the concentration of the antimony within the antimony-doped source/drain regions 114a, 114b has been found to increase deposition rates by over twice the growth rate compared to processes without any antimony containing precursor. In some embodiments, the growth rate of the antimony-doped source/drain regions 114a, 114b is near zero on both crystalline and non-crystalline locations of the substrate at temperatures less than 550° C. without the simultaneous co-flow of both the antimony-containing precursor and the chlorinated silicon containing precursor. The antimony within the antimony-containing precursor acts to lower the surface activation energy of the first layers 106, so that the antimony-doped source/drain regions 114a, 114b are formed. The growth rate of the antimony-doped source/drain regions 114a, 114b is highly selective to crystalline structures, such that the growth rate of the antimony-doped source/drain regions 114a, 114b on the first layers 106 is greater than about 100× the growth rate of the antimony-doped source/drain regions s 114a, 114b on the spacers 110 and the gate structure 112, such as greater than about 150× the growth rate. In some embodiments, the growth rate of the antimony-doped source/drain regions 114a, 114b is about 10 angstroms/minute to about 20 angstroms/minute. In some embodiments, the growth rate of the source region and the drain region on the crystalline first layers is greater than about 50 times the growth rate on the non-crystalline second layers.

The growth rate of the antimony-doped source/drain regions 114a, 114b is primarily along <110> directions during processes described herein, such that the growth rate of the antimony-doped source/drain regions 114a, 114b along the <110> direction is greater than 50% higher than the growth rates in either the <100> or <111> directions, such as greater than 100% higher than the growth rates in either the <100> or <111> directions. The high growth rate in the <110> direction compared to the <100> or <111> direction reduces faceting of the antimony-doped source/drain regions 114a, 114b and allows for continuous growth of the antimony-doped source/drain regions 114a, 114b from the surface of the first layers 106.

The selective deposition of the antimony-doped source/drain regions 114a, 114b and the directional growth rate of the antimony-doped source/drain regions 114a, 114b form gaps 111 between the spacers 110 and the antimony-doped source/drain regions 114a, 114b. The gaps 111 are air gaps and separate the spacers 110 and the antimony-doped source/drain regions 114a, 114b to further isolate the spacers 110 from the source/drain 116a, 116b. The contact resistance between the first layers 106 and the antimony-doped source/drain regions 114a, 114b is about 0.3 mΩ·cm$^2$ to about 3 mΩ·cm$^2$.

In some embodiments, the deposition of the antimony-doped source/drain regions 114a, 114b is performed in a first processing chamber and the doping of the antimony-doped source/drain regions 114a, 114b with P is performed in a second processing chamber. In yet other embodiments, the formation of the antimony-doped source/drain regions 114a, 114b and the doping of the antimony-doped source/drain regions 114a, 114b are performed in one chamber.

After the second operation 304, a third operation 306 of thermally treating the hGAA structure 100 is performed. Thermal treatment of the hGAA structure is a spike anneal process. The spike anneal process is performed at temperatures of about 900° C. to about 1200° C. for a time of about 1 second to about 30 seconds. Due to the large size of the Sb atoms, the Sb atoms do not diffuse at the same rate as the P dopant. The short time period of the spike anneal thus suppresses Sb atom diffusion, while allowing some P dopant to diffuse in the first layers 106 to form a doped region 120 of the first layers 106 of the multi-material layer 105 as shown in FIG. 2C.

As the temperature of the second and third operations is kept bellow about 550° C., the diffusion of dopants and warpage of the multi-material layer 105 is reduced.

A capping layer (not shown) may be optionally deposited over the hGAA structure 100 after the formation of the antimony-doped source/drain regions 114a, 114b. The capping layer is a silicon containing layer and is deposited on top of each of the antimony-doped source/drain regions 114a, 114b and the spacers 110, such that the capping layer fills the gaps 111.

While the foregoing is directed to embodiments of the present disclosure, other and further embodiments of the disclosure may be devised without departing from the basic scope thereof, and the scope thereof is determined by the claims that follow.

What is claimed is:

1. A method of forming a semiconductor device comprising:
    forming a multi-material layer on a substrate, wherein the multi-material layer includes a plurality of crystalline first layers and a plurality of non-crystalline second layers arranged in an alternating pattern; and
    selectively forming a source region and a drain region on the crystalline first layers of the substrate, wherein the formed source region and drain region contain an antimony concentration of greater than about $5 \times 10^{20}$ atoms/cm$^3$, the forming the source region and the drain region further comprising:
        flowing a chlorinated silicon containing precursor;
        co-flowing an antimony-containing precursor with the chlorinated silicon containing precursor;
        co-flowing an n-type dopant precursor with the chlorinated silicon containing precursor and the antimony-containing precursor; and
        heating the substrate to a temperature of less than about 550° C., wherein a growth rate of the source region and the drain region on the crystalline first layers is greater than about 50 times a growth rate on the non-crystalline second layers.

2. The method of claim 1, wherein the n-type dopant precursor is a phosphorous containing precursor.

3. The method of claim 1, wherein the antimony concentration within the source region and the drain region is greater than about $2 \times 10^{21}$ atoms/cm$^3$.

4. The method of claim 1, wherein the non-crystalline second layers further comprise dielectric spacers disposed on an outer portion thereof.

5. The method of claim 4, wherein a plurality of gaps are formed adjacent to the non-crystalline second layers during the selective formation of the source region and the drain region.

6. The method of claim 1, wherein the chlorinated silicon containing precursor is one or a combination of dichlorosilane and trichlorosilane.

7. The method of claim 6, wherein the antimony-containing precursor is one or a combination of stibine, antimony trichloride, antimony tetrachloride, antimony pentachloride, triphenylantimony, antimony trihydride, antimonytrioxide, antimony pentoxide, antimony trifluoride, antimony tribromide, antimonytriiodide, antimony pentafluoride, Triethyl antimony, and trimethyl antimony.

8. The method of claim 7, wherein the antimony-containing precursor is Triethyl antimony.

9. A method of forming a semiconductor device comprising:
    selectively growing a source region and a drain region on a substrate in a predominantly <110> direction, wherein the source and the drain regions contain an antimony concentration of greater than about $5 \times 10^{20}$ atoms/cm$^3$, the selectively growing the source and the drain regions further comprising:
        flowing a chlorinated silicon containing precursor into a process chamber with the substrate;
        co-flowing an antimony-containing precursor with the chlorinated silicon containing precursor into the process chamber;
        co-flowing a phosphorous dopant precursor with the chlorinated silicon containing precursor and the antimony-containing precursor into the process chamber; and
        heating the substrate to a temperature of less than about 550° C. during the flowing of the chlorinated silicon containing precursor, the antimony-containing precursor, and the phosphorous dopant precursor, wherein a ratio of the chlorinated silicon containing precursor, the antimony-containing precursor, and the phosphorous dopant precursor is in a range from about 5:1:5 to about 20:1:20.

10. The method of claim 9, wherein a multi-material layer is disposed on the substrate and the multi-material layer includes a plurality of crystalline first layers and a plurality of non-crystalline second layers arranged in an alternating pattern, the source region and the drain region being selectively grown on the crystalline first layers.

11. The method of claim 10, wherein the non-crystalline second layers further comprise dielectric spacers disposed on an outer portion thereof.

12. The method of claim 11, wherein a plurality of gaps are formed adjacent to the non-crystalline second layers during the selective formation of the source region and the drain region.

13. The method of claim 11, wherein a growth rate of the source region and the drain region on the crystalline first layers is greater than about 100 times a growth rate on the dielectric spacers.

14. The method of claim 9, wherein the chlorinated silicon containing precursor is one or a combination of dichlorosilane and trichlorosilane and the antimony-containing precursor is Triethyl antimony.

15. The method of claim 9, wherein a growth rate of the source region and the drain region is about 10 angstroms/minute to about 20 angstroms/minute.

16. The method of claim 9, wherein the temperature is less than about 450° C.

17. A method of forming a semiconductor device comprising:
    forming a multi-material layer on a substrate, wherein the multi-material layer includes a plurality of crystalline first layers and a plurality of non-crystalline second layers arranged in an alternating pattern, the non-crystalline first layers comprising dielectric spacers disposed on an outer sidewall thereof; and selectively forming a source region and a drain region on the crystalline first layers of the substrate, wherein the formed source region and drain region contain an antimony concentration of greater than about $5 \times 10^{20}$ atoms/cm$^3$ and gaps are defined adjacent to the dielectric spacers and the formed source region and drain region, the forming the source region and the drain region further comprising:

flowing dichlorosilane and trichlorosilane;

co-flowing an antimony-containing precursor with the dichlorosilane and trichlorosilane;

co-flowing an n-type dopant precursor with the dichlorosilane, the trichlorosilane, and the antimony-containing precursor; and heating the substrate to a temperature of less than about 550° C.

18. The method of claim 17, wherein a growth rate of the source region and the drain region on the crystalline first layers is greater than about 50 times a growth rate on the dielectric spacers.

19. The method of claim 17, wherein the temperature is less than 500° C.

20. The method of claim 17, wherein the source region and drain region are formed on outer ends of the crystalline first layers.

* * * * *